(12) United States Patent
Robert et al.

(10) Patent No.: US 7,932,118 B2
(45) Date of Patent: Apr. 26, 2011

(54) METHOD OF PRODUCING MECHANICAL COMPONENTS OF MEMS OR NEMS STRUCTURES MADE OF MONOCRYSTALLINE SILICON

(75) Inventors: Philippe Robert, Grenoble (FR); Valérie Nguyen, Varces (FR)

(73) Assignee: Commissariat a l'Energie Atomique, Paris (FR)

( * ) Notice: Subject to any disclaimer, the term of this patent is extended or adjusted under 35 U.S.C. 154(b) by 209 days.

(21) Appl. No.: 12/336,930

(22) Filed: Dec. 17, 2008

(65) Prior Publication Data
US 2009/0170231 A1 Jul. 2, 2009

(30) Foreign Application Priority Data
Dec. 28, 2007 (FR) ...................... 07 60426

(51) Int. Cl.
*H01L 21/00* (2006.01)
(52) U.S. Cl. .................. 438/53; 257/E21.219
(58) Field of Classification Search .................. 438/422; 257/E21.305
See application file for complete search history.

(56) References Cited

U.S. PATENT DOCUMENTS

| | | | |
|---|---|---|---|
| 5,198,390 A | | 3/1993 | MacDonald et al. |
| 6,635,506 B2 * | | 10/2003 | Volant et al. ............ 438/52 |
| 7,037,851 B2 * | | 5/2006 | Gueneau de Mussy et al. ............ 438/739 |
| 7,494,839 B2 * | | 2/2009 | Benzel et al. ............ 438/53 |
| 2005/0199970 A1 | | 9/2005 | Monfray et al. |
| 2006/0096944 A1 | | 5/2006 | Metzger et al. |

FOREIGN PATENT DOCUMENTS

| | | |
|---|---|---|
| DE | 102 35 371 A1 | 2/2004 |
| FR | 2 857 952 A | 1/2005 |

OTHER PUBLICATIONS

French Search Report, (Oct. 2008).
* cited by examiner

*Primary Examiner* — Chandra Chaudhari
(74) *Attorney, Agent, or Firm* — Pearne & Gordon LLP

(57) ABSTRACT

A mechanical component production method of a MEMS/NEMS structure from a monocrystalline silicon substrate includes forming anchoring zones in one face of the substrate. A lower protective layer, non-silicon, obtained by epitaxy from the face of the substrate is formed on the face. A silicon layer obtained by epitaxy from the lower protective layer is formed on the lower protective layer. An upper protective layer is formed on the silicon layer. The upper protective, silicon and lower protective layers are etched according to a pattern defining the component, until the substrate is reached, providing access routes to the substrate. A protective layer is formed on the walls formed by the etching in the epitaxied silicon layer. The component is released by isotropic etching of the substrate from the access routes, wherein the isotropic etching does not attack the lower and upper protective layers and the protective layer of the walls.

16 Claims, 4 Drawing Sheets

METHOD OF PRODUCING MECHANICAL COMPONENTS OF MEMS OR NEMS STRUCTURES MADE OF MONOCRYSTALLINE SILICON

TECHNICAL FIELD

The invention relates to a method of producing mechanical components of MEMS (Micro-Electro-Mechanical System) or NEMS (Nano-Electro-Mechanical System) structures made of monocrystalline silicon. These structures are in particular used for the production of sensors and actuators.

PRIOR ART

The use of monocrystalline silicon for the formation of MEMS or NEMS components is interesting in several respects. Its mechanical properties are excellent, particularly compared to polycrystalline silicon. High thicknesses may be used (in the case of polycrystalline silicon, the thickness is generally limited to 20 μm). It has very good piezoelectric properties. Its semiconducting properties, well known and well controlled, enable a co-integration of these mechanical components with the associated electronics.

In the prior art, there are three major ways of producing MEMS/NEMS structures made of monocrystalline silicon, in other words released mechanical components, able to be displaced under the action of an external force, in surface technology.

SOI technology is the most widespread. In this case, the component is produced on the active layer of the SOI substrate and the buried oxide serves both as silicon etch stop layer and sacrificial layer. The release of the mechanical structure takes place by the front face of the substrate. A first alternative consists in etching all the rear face to release the mechanical component, stopping on the buried oxide. The release then takes place by the rear face of the substrate. A second alternative consists in transferring the SOI substrate onto a cavity to release it by simple etching of the silicon.

The interest of SOI technology for MEMS is based on the buried oxide which makes it possible, at one and the same time:
  to serve as stop layer to the etching of silicon, and thus to define with precision the thickness of the silicon layer on which the component will be formed (whatever the alternative embodiment),
  to serve as sacrificial layer (in the case of a front face method principally),
  to have an electrically insulating layer supporting the MEMS/NEMS component (to avoid placing all of the elements of the MEMS or NEMS in short-circuit).

On the other hand, the major drawback of SOI technology is its high price. Problems of poorly controlled stresses in the SOI have also recently been observed which, in certain configurations, are very detrimental to MEMS/NEMS.

In SON (Silicon-on-Nothing) technology, a layer of SiGe is grown on a standard silicon substrate and, on this layer of SiGe, is grown a monocrystalline silicon layer. The MEMS/NEMS component is produced on this latter silicon layer and the SiGe serves as sacrificial layer. For the release, a dry etching of SiGe based on $CF_4$ is used, which is selective compared to monocrystalline silicon.

The main interest of SON technology is that it is a low cost method. It also makes it possible to have access to very low silicon thicknesses (typically several 100 nm), for example for NEMS. On the other hand it has multiple drawbacks.

Isotropic etching of SiGe is quite poorly selective compared to silicon, thereby limiting the technique to releases of narrow patterns (typically below one μm). The thickness of silicon epitaxied on the SiGe is generally limited to several hundreds of nanometers (dislocations risk appearing if it is wished to obtain high silicon thicknesses). SiGe is semiconductor. To have electrically insulated zones on the MEMS/NEMS, this requires placing an insulating layer in the zones that have to be electrically insulated (depositing $SiO_2$ or SiN for example). The silicon layer epitaxied above this insulating layer will be polycrystalline (and not monocrystalline). This point may be quite critical since these zones correspond to anchoring zones where the material is particularly put under strain. The fact of having a polycrystalline material in these anchoring zones (rather than monocrystalline) leads either to having a less good quality factor, in the case of resonating structures, or to being more sensitive to mechanical stresses (for example impact resistance).

In SCREAM technology, a standard substrate is used to produce a MEMS component and a "buried" part of the solid silicon is used as sacrificial layer. The method is broken down in the following manner: DRIE (Deep Reactive Ion Etching) etching of the MEMS structure, thermal oxidation, anisotropic etching of the oxide, isotropic etching of the silicon to release the MEMS, metallisation of the structure (on the sides and the top).

The principal interest of SCREAM technology is its simplicity and its low cost aspect.

It has, on the other hand, many drawbacks. There is no insulating anchoring. This results in the creation of significant mechanical stress on the MEMS (due to the presence of the thermal oxide and metal on the released structures). This addition of oxide and metal on the monocrystalline silicon renders the mechanical component less good (poorer quality factor in the case of a resonator for example). Metallisation, which takes place after release of the structure, necessitates the use of a mechanical masking during the deposition. This method is not very industrial and gives a very mediocre resolution of patterns.

SCREAM technology procures poorly defined structures and which are etched underneath the mask of oxide during the isotropic etching of the silicon (absence of oxide underneath the structure to be released).

DESCRIPTION OF THE INVENTION

The present invention has been designed to overcome the abovementioned drawbacks of the prior art.

The method according to the invention may be used for all MEMS and NEMS applications. It uses a technology adapted to low cost and high volume markets: mobile telephony, automobiles, games, etc. By way of example, the following may be cited:
  for automobiles: accelerometers, gyrometers, pressure sensors, chemical sensors based on MEMS or NEMS mechanical resonators,
  for mobile telephony: time bases (RF resonators), MEMS or NEMS mechanical filters, accelerometers, microphones,
  for games: accelerometers, gyrometers.

The invention concerns a method of producing at least one mechanical component of MEMS or NEMS structure from a monocrystalline silicon substrate, comprising the steps of:
  a) forming anchoring zones in one face of the substrate to delimit at least in part the mechanical component,
  b) forming, on said face of the substrate, a lower protective layer made of material other than silicon and obtained by epitaxy from said face of the substrate, wherein this lower protective layer is monocrystalline at least outside of the anchoring zones, c) forming, on the lower protective layer, a silicon layer obtained by epitaxy from the lower protective layer, wherein this silicon layer is monocrystalline at least outside of the anchoring zones, d) forming an upper protective layer on the silicon layer, e) etching the upper protective layer, the silicon layer and the lower protective layer, between the anchoring zones, according to a pattern defining the mechanical component, until the monocrystalline silicon substrate is reached and to provide the access routes to the monocrystalline silicon substrate, f) forming a protective layer on the walls formed by the etching of the pattern of the mechanical component in the epitaxied silicon layer, g) releasing the mechanical component by isotropic etching of the monocrystalline silicon substrate from the access routes to the monocrystalline silicon substrate, this isotropic etching not attacking the lower and upper protective layers and the protective layer of the walls.

Advantageously, the anchoring zones may enable the mechanical component to be electrically insulated from the remainder of the substrate. These anchoring zones are then made of dielectric material.

During step e), the upper protective layer, the silicon layer and the lower protective layer may also be etched in the anchoring zones according to a pattern suited to creating an electrically insulating zone in the epitaxied layers.

According to a particular embodiment, before step e), a step of producing electrical contact pads for the mechanical component is provided for. This embodiment may comprise the deposition of a layer of electrically conducting material (for example made of Al or AlSi) and its etching. The electrical contact pads may be arranged on the anchoring zones.

According to a specific embodiment, the mechanical component is manufactured by inserting between steps c) and d) at least the following two steps:

forming, on the structure obtained in step c), an intermediate layer made of material other than silicon and obtained by epitaxy from the silicon layer deposited just previously, wherein this intermediate layer is monocrystalline at least outside of the anchoring zones, forming, on the intermediate layer deposited just previously, a silicon layer obtained by epitaxy from this intermediate layer, wherein this silicon layer is monocrystalline at least outside of the anchoring zones.

The anchoring zones may be formed by producing trenches in said face of the substrate and by filling these trenches by an anchoring material. The anchoring material may be a material enabling successively the formation of a layer epitaxied simultaneously with the lower protective layer and the formation of another layer epitaxied simultaneously with the silicon layer.

The protective layer of the walls may be formed by deposition or epitaxy of a protective layer closely hugging the relief of the structure etched in step e), then by anisotropic etching of this protective layer.

By way of example, the anchoring zones formed in the face of the substrate are made of silicon nitride or silicon oxide, the protective layer made of material other than silicon is SiGe, the upper protective layer is made of silicon nitride or silicon oxide and the protective layer on the walls is made of a material chosen among SiGe, silicon oxide and silicon nitride.

BRIEF DESCRIPTION OF DRAWINGS

The invention will be better understood and other advantages and particularities will become clear on reading the description that follows, given as a non limiting example, and by referring to the appended figures in which.

DETAILED DESCRIPTION OF EMBODIMENTS OF THE PRESENT INVENTION

Figure 1A:
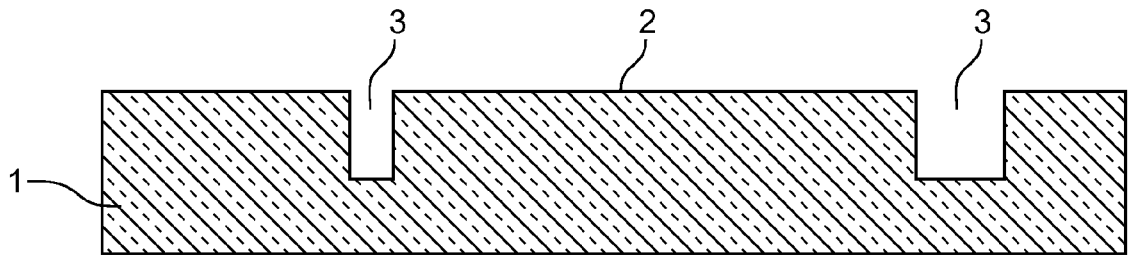
FIGS. 1A to 1I illustrate an implementation of the production method according to the present invention.

According to the present invention, it is proposed to use a stacking of layers enabling the production of MEMS or NEMS structures made of monocrystalline silicon, produced on the basis of planar, CMOS compatible technologies, which do not use SOI substrate. The objective being to have a low cost, CMOS compatible method and enabling a wide range of MEMS and NEMS patterns made of monocrystalline silicon to be addressed (in other words hardly dependent on design rules).

To do this, solid silicon is used to provide the sacrificial layer of the MEMS/NEMS structure. Anchorings, if necessary made of electrically insulating material, forming stop zones to the etching serving to release the mechanical components are provide for. The MEMS or NEMS component is produced from an epitaxied monocrystalline silicon layer. The machined MEMS or NEMS component is completely protected before the release step by layers resistant to the release etching chemistry. These layers comprise a lower protective layer (protecting the mechanical component from below), an upper protective layer (protecting the mechanical component from above) and a protective layer of the walls formed by the etching of the pattern of the mechanical component.

The lower protective layer is made of monocrystalline material, other than silicon, and is epitaxied from the substrate made of monocrystalline silicon. It has the following characteristics. It enables a re-growth of monocrystalline silicon by epitaxy, with if necessary a possibility of in situ doping of the silicon thus epitaxied. It withstands a dry or wet etching of the silicon (selective etching) without being attacked, or being weakly attacked. If necessary, it may be etched selectively compared to the silicon by a dry or wet etching method.

The upper protective layer and the protective layer of the walls of the component to be released have the following characteristics.

They can withstand a dry or humid etching of the silicon (selective etching) without being attacked, or being weakly attacked. If necessary, they may be etched selectively compared to the silicon by a dry or wet etching method. Preferentially, the top protective layer (or stop layer in the description of the stacking) is selective to the etching of the protective layer of the walls (in other words, it is not etched or is only slightly etched, during the step of etching the protective layer of the walls).

The bottom protective layer may for example be monocrystalline SiGe. The protective layer of the walls may for example be SiGe (monocrystalline or polycrystalline), $SiO_2$, SiN, etc. This layer must be conformable (to properly cover the walls). The protective layer on the top (stop layer) may for example be $SiO_2$, SiN, etc.

Electrically insulating (and/or etch stop) anchorings may be produced, before the deposition of the lower protective layer, by etching the solid silicon, then by filling the cavities thereby produced by depositing an insulating material (for example $SiO_2$ or SiN) and by removing the excess by CMP planarisation or by the sequence litho-etching and CMP. In the case where these anchorings only serve as etch stop, the material for filling the cavities may be insulator, conductor or semiconductor.

FIGS. 1A to 1I illustrate the main steps of an implementation of the production method according to the present invention. These figures are transversal sectional views.

In FIG. 1A, reference 1 designates a solid substrate made of monocrystalline silicon. From the upper face 2 of the substrate 1, are produced trenches 3 intended to receive the anchoring zones serving to electrically insulate and/or delimit the mechanical component to be produced.

Figure 1B:
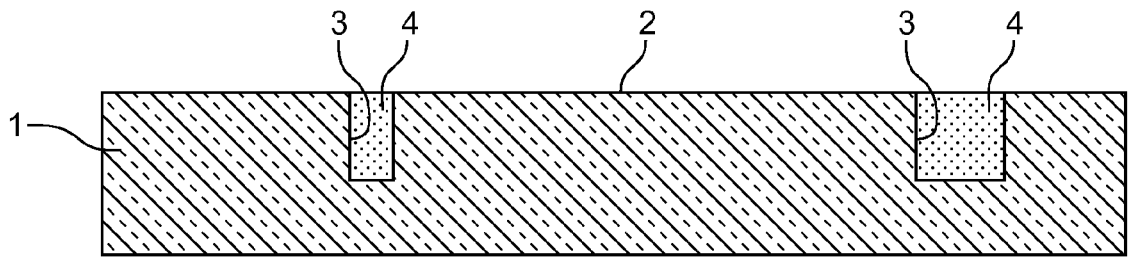

The trenches 3 are then filled by deposition of an anchoring material (for example SiN, $SiO_2$, etc.) followed by a chemical mechanical polishing (or CMP) with stoppage on the face 2 of the substrate 1. The result obtained is shown in FIG. 1B. Reference 4 designates the anchorings obtained.

Figure 1C:
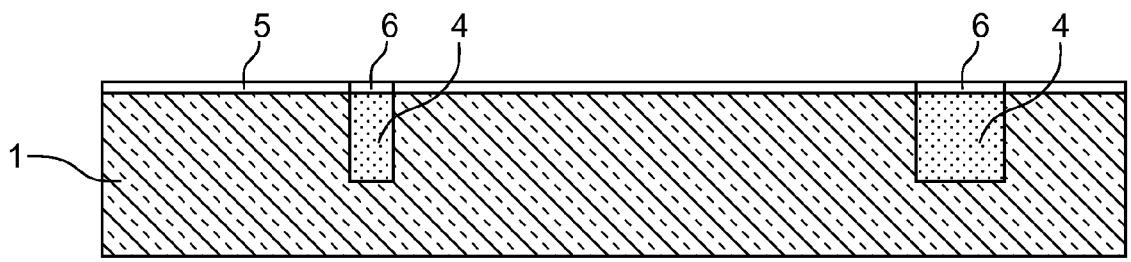
Figure 1D:
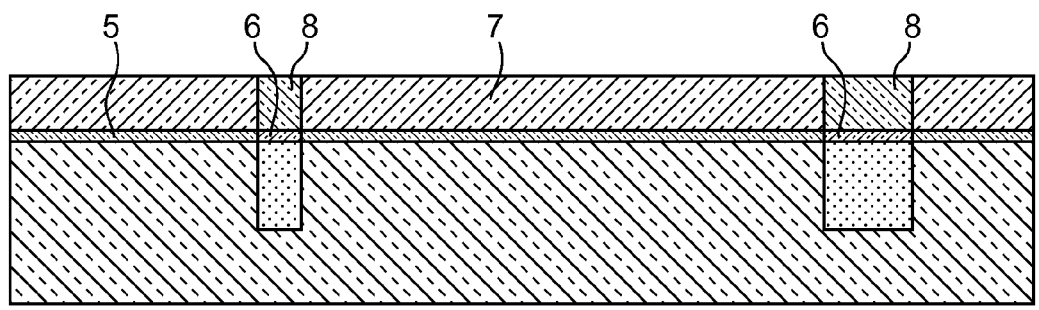

The epitaxy of a monocrystalline layer is then carried out on the face 2 of the substrate 1, for example a layer 5 of SiGe of 50 nm thickness to obtain the lower protective layer (see FIG. 1C). Since the substrate 1 is monocrystalline, the epitaxied layer 5 is also monocrystalline. On the other hand, on the anchorings 4, the epitaxied zones 6 are made of polycrystalline SiGe.

The epitaxy of the silicon layer is then carried out, of several tens of nm to several μm thickness, on the layer 5 and the zones 6. On the layer 5, a monocrystalline silicon layer 7 and, on the zones 6, zones 8 of polycrystalline silicon are obtained (see FIG. 1D).

Figure 1E:
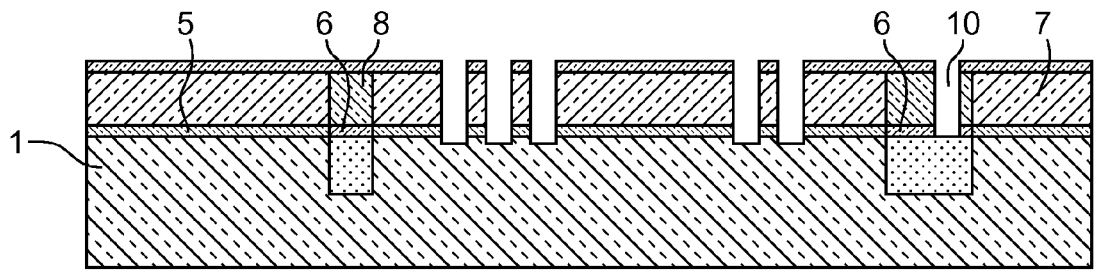

As shown in FIG. 1E, the upper protective layer or stop layer 9 is then deposited on the structure obtained previously. This stop layer 9 is selective compared to the release etching of the mechanical component, in other words compared to the monocrystalline silicon of the substrate, and preferentially compared to the lower protective layer 5. It is for example a layer of $SiO_2$. A DRIE litho-etching is then carried out of the upper protective layer 9, the silicon layer 7 and the lower protective layer 5, between the anchoring zones, according to a pattern defining the mechanical component, until the substrate made of silicon 1 is reached and exposed and to provide access routes 10 to this substrate.

Figure 1F:
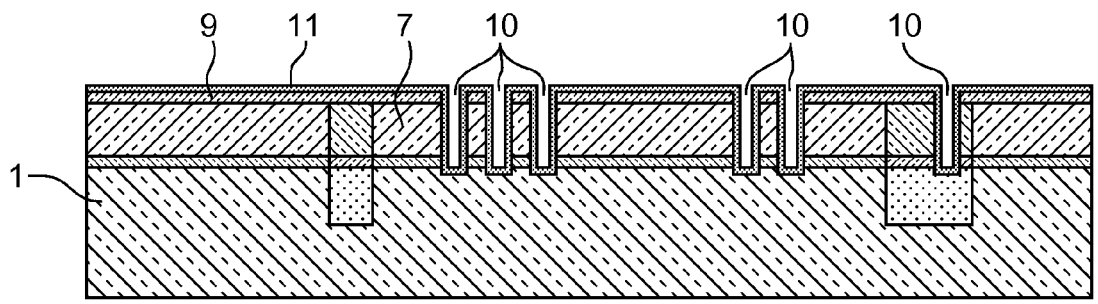
Figure 1G:
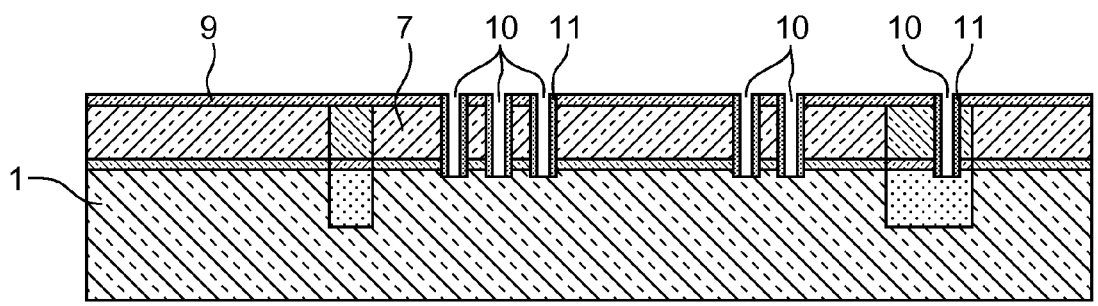
Figure 1H:
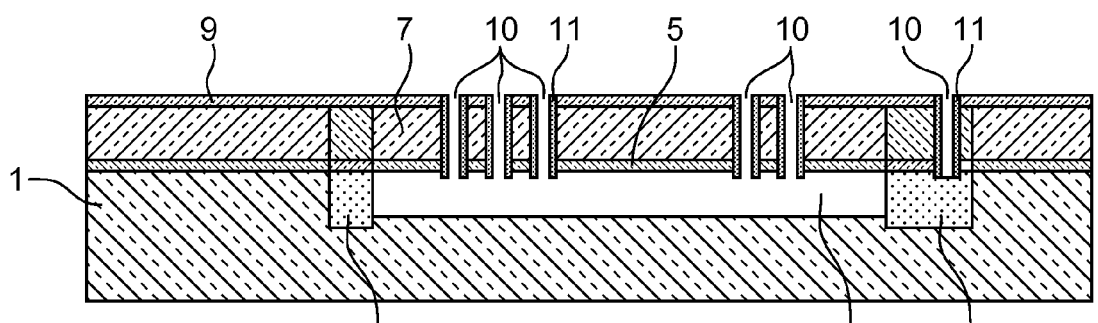

Then, a protective layer of the walls formed by the etching of the pattern of the mechanical component is formed by deposition or by epitaxy. Once formed, this protective layer 11 overlays the upper protective layer 9, the walls of the access routes 10 and the base of the access routes, in other words the silicon substrate 1 exposed previously. This is shown in FIG. 1F.

The protective layer 11 is then etched in an anistropic manner with stoppage on the upper protective layer 9. This etching makes it possible to conserve the protective layer 11 only on the walls of the access routes 10, the silicon of the substrate 1 again being exposed (see FIG. 1G).

The isotropic etching of the silicon of the substrate 1, between the anchorings 4 may then be carried out. This etching is selective compared to the protective layers 5, 9 and 11. The silicon of the mechanical component, in other words the material of the layer 7, remains intact. A cavity 12 underneath the mechanical component thereby released (see FIG. 1H) is obtained. The etched thickness of the substrate 1 may be between several hundreds of nm and several μm.

Figure 1I:
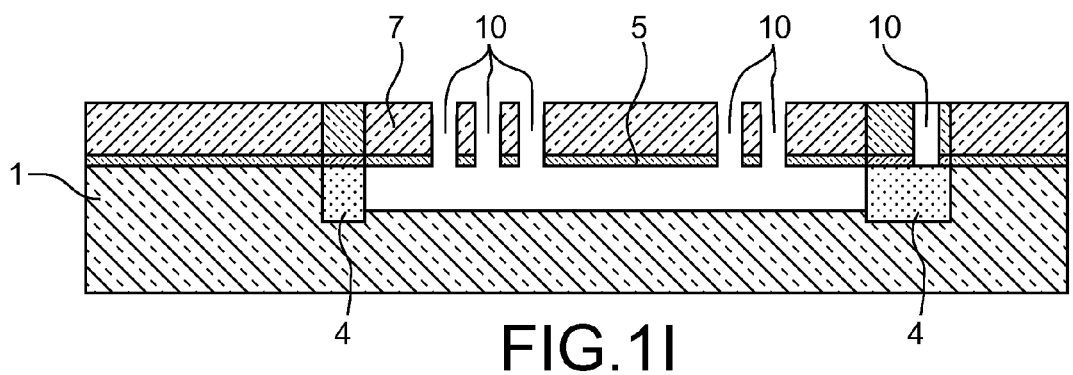

The elimination, by selective etching compared to the monocrystalline silicon, of the upper protective layer or stop layer 9 and the protective layer of the walls 11 may then be carried out. The result obtained is shown in FIG. 1I. If necessary, the lower protective layer 5 may also be eliminated by selective etching.

The anchorings in the silicon may serve to electrically insulate the MEMS/NEMS structure once released, but they can also serve as etch stop in the release step. In the case where electrical insulation is not necessary, these anchorings may if necessary be conductors or semiconductors and simply play said role of etch stop. Obviously, this assumes that the material of these anchorings is not etched during said release step. Those skilled in the art will know which material to use.

Additional steps may be inserted in this method, such as for example a metallisation of the structure for remaking contact before the etching of the MEMS, or a deposition and a planarisation of the MEMS once released to continue other steps at the end of the method. The additional materials and steps obviously must be compatible with the complete method described previously. Nevertheless, those skilled in the art will be capable of determining them.

Figure 2A:
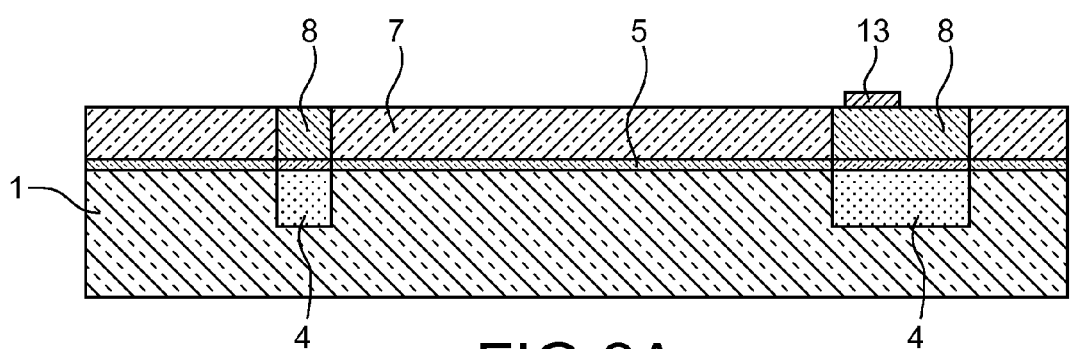
FIGS. 2A to 2C illustrate additional steps of the production method according to the present invention.
Figure 2B:
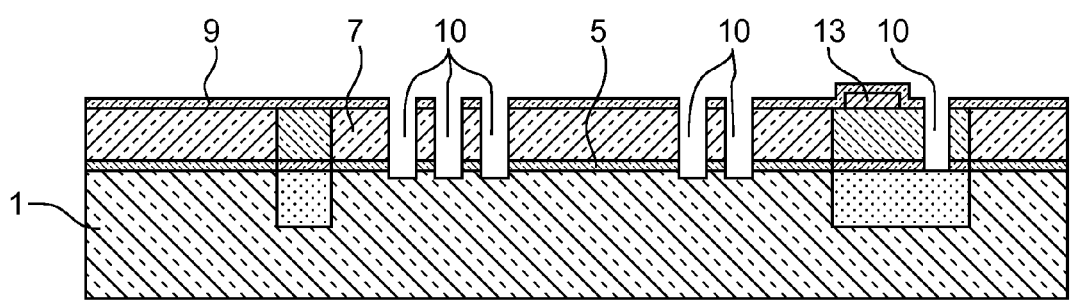
Figure 2C:
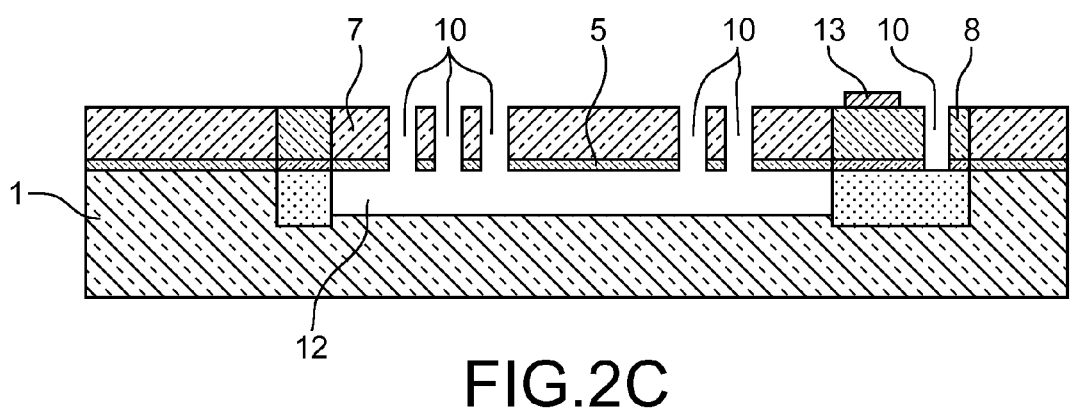

By way of example, FIGS. 2A to 2C illustrate an addition of steps for producing contact pads. In these figures, elements the same as those in FIGS. 1A to 1I are referenced in an identical manner.

After the silicon epitaxy step, providing the monocrystalline silicon layer 7 and the zones 8 of polycrystalline silicon, electrical contact pads are formed on the zones 8. These contact pads are formed by deposition of a metallic layer and litho-etching. FIG. 2A shows one of these pads 13.

The deposition of the upper protective layer or stop layer 9 and the DRIE litho-etching of the upper protective layer 9, the silicon layer 7 and the lower protective layer 5 are then carried out, until the substrate made of silicon 1 is reached and exposed and to provide the access routes 10 to the substrate. This is shown in FIG. 2B.

FIG. 2C represents the structure obtained at the end of the method according to the invention.

Figure 3A:
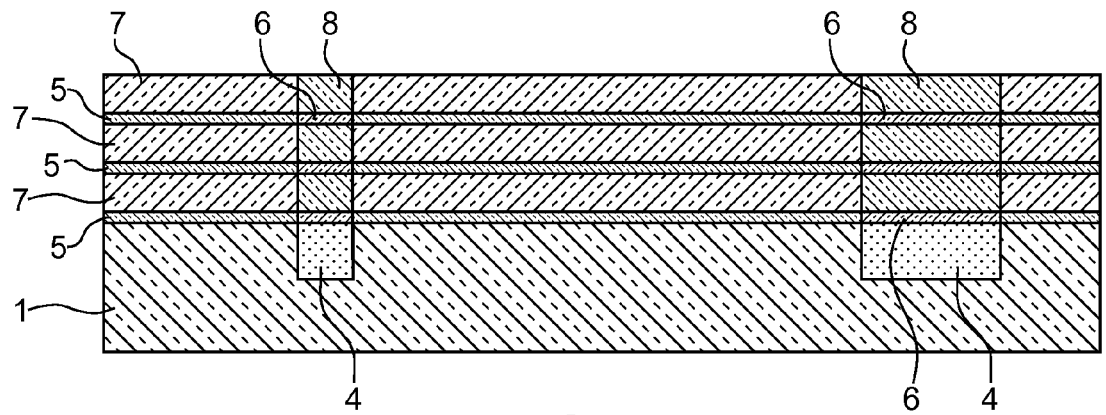
FIGS. 3A and 3B illustrate an implementation of the production method according to the present invention, enabling the manufacture of a stacking of mechanical components.
Figure 3B:
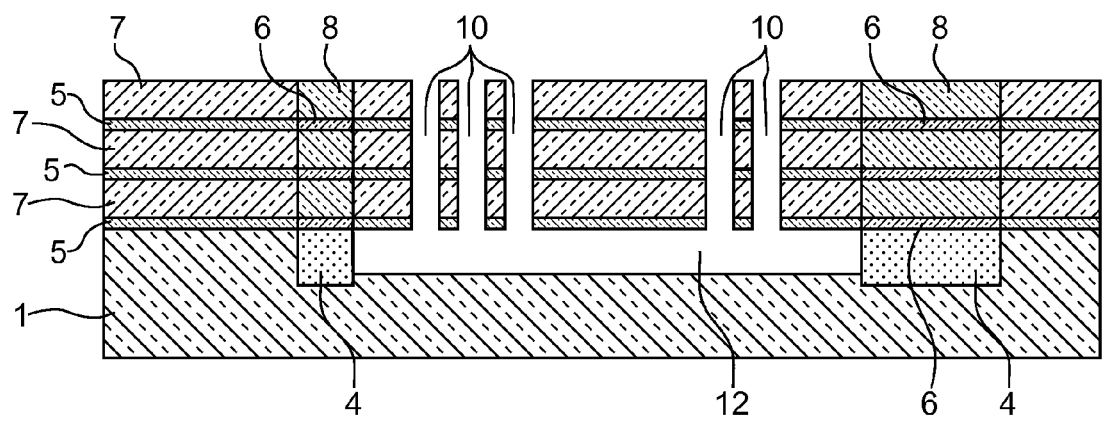

FIGS. 3A and 3B illustrate an implementation of the production method according to the present invention, enabling the manufacture of a stacking of mechanical components.

This stacking is obtained by alternating protective layer 5 made of monocrystalline material other than silicon (and enabling an epitaxy of monocrystalline silicon), for example SiGe and monocrystalline silicon layer epitaxied 7 on the substrate 1 provided with its anchorings 4 (see FIG. 3A). The different epitaxies also make the epitaxied zones 6 made of polycrystalline SiGe and 8 made of polycrystalline silicon alternate.

The subsequent steps are identical to the corresponding steps already described. After the release step and the elimination of the upper stop layer and the protective layer of the walls, the structure represented in FIG. 3B is obtained.

The invention procures a certain number of advantages. It enables a low cost technological stacking based on conventional microelectronics technological steps and using a standard substrate. The method of the invention may be CMOS compatible. It procures an embedment that may be electrically insulating and therefore not requiring the MEMS or the NEMS to be insulated by additional dielectric and metallic depositions such as used in the SCREAM technique. In the case where the protective layer of the silicon is SiGe, the etching of the silicon may be highly selective compared to said SiGe. Large patterns may therefore be released, which provides flexibility as to the patterns that may be produced using this technology. The anchorings, electrically insulating or not, produced in the silicon may serve as etch stop during the release step. The result is a better control of the release step (no risk of over-etching for example) and an access to varied patterns: the shape of the structures released is no longer limited by the isotropic nature of the release etching, leading for example to the possibility of producing square and hexagonal suspended membranes, and no longer only circular membranes.

The invention claimed is:

1. Method of producing at least one mechanical component of MEMS or NEMS structure from a monocrystalline silicon substrate (1), comprising the steps of:
   a) forming anchoring zones (4) in one face (2) of the substrate (1) to delimit at least in part the mechanical component,
   b) forming, on said face (2) of the substrate (1), a lower protective layer (5) made of material other than silicon and obtained by epitaxy from said face of the substrate, wherein this lower protective layer is monocrystalline at least outside of the anchoring zones,
   c) forming on the lower protective layer (5) a silicon layer (7) obtained by epitaxy from the lower protective layer, wherein this silicon layer (7) is monocrystalline at least outside of the anchoring zones,
   d) forming an upper protective layer (9) on the silicon layer (7),
   e) etching the upper protective layer (9), the silicon layer (7) and the lower protective layer (5), between the anchoring zones (4), according to a pattern defining the mechanical component, until the monocrystalline silicon substrate (1) is reached and to provide access routes (10) to the monocrystalline silicon substrate,
   f) forming a protective layer (11) on the walls formed by the etching of the pattern of the mechanical component in the epitaxied silicon layer (7),
   g) releasing the mechanical component by isotropic etching of the monocrystalline silicon substrate (1) from the access routes (10) to the monocrystalline silicon substrate, this isotropic etching not attacking the lower (5) and upper (9) protective layers and the protective layer of the walls (11).

2. Method according to claim 1, in which, during step e), the upper protective layer, the silicon layer and the lower protective layer are also etched in the anchoring zones according to a pattern suited to creating an electrically insulating zone in the epitaxied layers.

3. Method according to claim 1, in which, before step e), a step of producing electrical contact pads (13) for the mechanical component is provided for.

4. Method according to claim 3, in which the production of the electrical contact pads (13) comprises the deposition of a layer of electrically conducting material and its etching.

5. Method according to one of claims 3 or 4, in which the electrical contact pads (13) are arranged on the anchoring zones.

6. Method according to claim 1, in which the mechanical component is manufactured by inserting between steps c) and d) at least the following two steps:
   forming, on the structure obtained in step c), an intermediate layer made of material other than silicon and obtained by epitaxy from the silicon layer deposited just previously, wherein this intermediate layer is monocrystalline at least outside of the anchoring zones,
   forming on the intermediate layer deposited just previously a silicon layer obtained by epitaxy from this intermediate layer, wherein this silicon layer is monocrystalline at least outside of the anchoring zones.

7. Method according to claim 1, in which the anchoring zones are formed by producing trenches (3) in said face (2) of the substrate (1) and by filling these trenches with an anchoring material (4).

8. Method according to claim 7, in which the anchoring material is a material enabling successively the formation of a layer epitaxied (6) simultaneously with the lower protective layer (5) and the formation of another layer epitaxied (8) simultaneously with the silicon layer (7).

9. Method according to any of claim 1, in which the protective layer of the walls is formed by deposition or epitaxy of a protective layer (11) closely hugging the relief of the structure etched in step e), then by anisotropic etching of this protective layer (11).

10. Method according to any of claim 1, in which the anchoring zones are formed from an electrically insulating material.

11. Method according to any of claim 1, in which the anchoring zones formed in the face (2) of the substrate (1) are made of silicon nitride or silicon oxide.

12. Method according to claim 1, in which the lower protective layer made of material other than silicon is SiGe.

13. Method according to claim 1, in which the upper protective layer (9) is made of silicon nitride or silicon oxide.

14. Method according to claim 1, in which the protective layer on the walls (11) is made of a material chosen among SiGe, silicon oxide and silicon nitride.

15. Method according to claim 1, in which, after the release step of the mechanical component, a step of elimination of the upper protective layer (9) and the protective layer of the walls (11) is provided for.

16. Method according to claim 1, in which, after the step of release of the mechanical component, a step of elimination of the lower protective layer (5) is provided for.

* * * * *